United States Patent [19]

Goronkin

[11] Patent Number: 5,016,064
[45] Date of Patent: May 14, 1991

[54] QUANTOM WELL STRUCTURE HAVING ENHANCED CONDUCTIVITY

[75] Inventor: Herbert Goronkin, Scottsdale, Ariz.

[73] Assignee: Motorola, Inc., Schaumburg, Ill.

[21] Appl. No.: 411,780

[22] Filed: Sep. 25, 1989

[51] Int. Cl.[5] .................. H01L 29/161; H01L 29/205; H01L 29/00; H01L 27/12
[52] U.S. Cl. .......................... 357/16; 357/4; 357/61
[58] Field of Search ................. 357/4, 16, 29

[56] References Cited

U.S. PATENT DOCUMENTS

| | | | |
|---|---|---|---|
| 4,665,412 | 5/1987 | Ohkawa et al. | 357/4 |
| 4,772,924 | 9/1988 | Bean et al. | 357/4 |
| 4,792,832 | 12/1988 | Baba et al. | 357/16 |
| 4,839,702 | 6/1989 | Grinberg et al. | 357/16 |
| 4,857,971 | 8/1989 | Burnham | 357/4 |

FOREIGN PATENT DOCUMENTS

| | | | |
|---|---|---|---|
| 61-276267 | 12/1986 | Japan | 357/16 |
| 1187861 | 7/1989 | Japan | 357/16 |

OTHER PUBLICATIONS

"Solid State Physics", 5th Edition, C. Kittel, 1976, Wiley & Sons, pp. 112-113.
"Stimulated Emission in Ultrathin (20 Å) $Al_xGa_{1-x}$-As-GaAs Single Quantum Well Hetero Structures", Lo et al, Appl. Phys. Lett., vol. 52, #22, 30 May 1988, pp. 1853-1855.

*Primary Examiner*—Rolf Hille
*Assistant Examiner*—Mahshid Saadat
*Attorney, Agent, or Firm*—Joe E. Barbee; Stuart T. Langley

[57] ABSTRACT

An enhanced conductivity superlattice made from semiconductor materials provides enhanced conductivity. It is believed that conductivity can be enhanced sufficiently to produce superconductivity well above typical superconductivity temperatures of the semiconductor materials. The enhanced conductivity quantum well is a superlattice structure having a monolayer phonon generator sandwiched between layers of a host material. Barrier layers surround the host material to confine the host material electrons. In another embodiment, the monolayer may be located within the barrier layers. The monolayer generates phonons having an optical energy which is lower than the optical energy of the host material. The generated phonons couple with low energy electrons or holes to propagate without dissipation of electron energy.

16 Claims, 1 Drawing Sheet 5,016,064

QUANTUM WELL STRUCTURE HAVING ENHANCED CONDUCTIVITY

BACKGROUND OF THE INVENTION

This invention relates, in general, to solid state conductors, and more particulary, to an enhanced conductivity structure made from semiconductor materials.

There has been much recent work done with superconductors. Most of this work centered around using superconducting oxide thin films. Researchers seeking to use superconducting oxide in thin films have faced many problems. The rare earth-barium-copper-oxides have reacted when heated above 300 degrees Kelvin. In some cases, the oxygen has dissipated from the superconductor material. Bismuth compounds have a very narrow processing range, and it is difficult to maintain stoichiometry during deposition in the temperature range required to synthesize the bismuth compounds as a superconductor. Thallium compounds also have very narrow processing range and further difficulties are encountered by the volatization of the thallium oxide.

The present invention uses semiconductor material in a manner to produce enhanced conductivity. It is believed that conductivity can be enhanced sufficiently to produce superconductivity at higher temperatures than would otherwise be possible in the semiconductor materials. The present invention does not use superconducting oxides. Accordingly, many problems of the prior art are avoided, particularly, since the present invention uses well know semiconductor materials and/or manufacturing processes.

An object of the present invention is to provide a new synthetic enhanced conductivity material that does not contain oxygen.

Another object of the present invention is to provide an enhanced conductivity material which is compatible with semiconductor integrated circuits.

A further object of the present invention is to enhance the conductivity of superlattice layers which involves selective coupling of electrons to phonons to control absorption and dissipation of electronic energy.

SUMMARY OF THE INVENTION

The above and other objects and advantages of the present invention are achieved by a novel superlattice semiconductor structure. The superlattice structure will provide electrons confined in a narrow energy gap material. The electrons are confined by barrier layers made of larger band gap material. The narrow gap material or the barrier material contains a monolayer of another material within its boundaries. The narrow gap material creates a first quantum well while the monolayer material creates a second quantum well within the first quantum well. In one embodiment of the present invention the narrow gap material and the larger band gap material both ocmprise III-V compound materials. The monolayer material is either a donor or acceptor to provide either electrons or holes as required for conduction as well as providing a source of phonons needed for pairing electrons or holes. In another embodiment, the monolayer material is neither a donor nor acceptor. It is an electrically inactive source of phonons which are generated for the purpose of electron-phonon or hole-phonon coupling in order to cause pairing of the respective charge carriers. In a preferred embodiment the superlattice structure will be repeated a multiplicity of times in order to generate increased electron-phonon coupling and increased current.

DETAILED DESCRIPTION OF THE INVENTION

Figure 1:
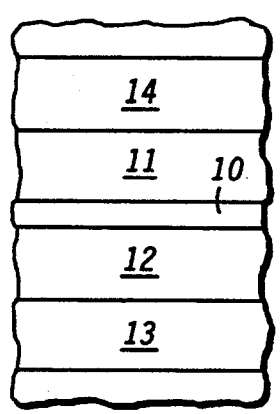
FIG. 1 illustrates an enlarged view of a small portion of the present invention.

The present invention enhances the conductivity of superlattice layers. It involves selective coupling of electrons to phonons to control dissipation of electronic energy. Phonon modes are determined by structural and mechanical parameters designed into the superlattice. Some phonon modes are completely eliminated while others are selectively enhanced to optimize the desired electro-phonon interaction. This invention is believed to result in artificial high temperature superconducting semiconductors. Superlattice structures are well know and have been studied in great detail over the past ten year. Almost all of the optical measurements have been made in the direction perpendicular to the superlattice planes, because that is the direction most accessible to the probe radiation. Electronic measurements have also been mostly restricted to the normal direction to examine resonant tunneling and quantum scattering phenomena. Until recently, there has been relatively little systematic work on conduction parallel to the superlattice planes in which the mechanical properties related to the perpendicular structure and composition can affect the longitudinal electronic properties. It is this area to which the present invention is directed. It is known that superlattices exhibit phonon modes which are different from bulk modes. These result from the confinement of phonon modes to individual superlattice layers. These modes can be designed to couple to electrons and holes and modify their transport properties. The present invention enhances strong electron-phonon coupling which is responsible for super conductivity according to the BCS theory; under proper conditions the enhanced conductivity superlattice of the present invention is believed to become superconductive. The present invention modifies the electon-phonon interactions to substantially enhance parallel conductivity over the bulk values. Aside from the obvious benefits of enhanced conductivity superlattices, in such a structure, with topside and buried "gates", the microscopic conductivity can be mounted over the wide ranges needed for useful devices.

Electrons moving through the crystal lattice absorb and emit phonons. When electrons are near the bottom of the conduction band, they interact with the acoustic phonon field which is characterized by a roughly parabolic dispersion of energy versus wave vector across about half of the Brillouin zone. In a superlattice, the Brillouin zone is divided into minizones and the E-k dispersion exhibits discontinuities at the minizone edges. If the Brillouin zone of the bulk crystal has a dimension equal to $k_b = 2\pi/a$ where a is the lattice spacing, the dimension of the superlattice minizone is $k_s = \pi/d$ where d (greater than a) is the period of the superlattice. When the E-k curve is drawn from $k_s = 0$ to $K_s = 2\pi/d$, the curve is said to be folded. Regardless of how the dispersion curve is displayed, it is readily seen that the superlattice has altered the phonon spectrum by introducing new phonons while eliminating others of energy corresponding the minizone energy gaps. The present invention selectively introduces certain phonon modes while degrading others in order to control the dissipation of electron energy.

The optical phonon modes are also substantially altered in superlattice. For instance, in a GaAs/AlAs superlattice with appropriate layer thicknesses optical phonons can be confined to the GaAs and AlAs layers. The in-plane optical phonon modes can propagate with exactly the same frequency as a bulk phonon. These high frequency modes cannot propagate normal to the superlattice plane due to the alternation of materials. In the case of AlAs/GaAs, the GaAs optical mode vibrations are damped approximately exponentially within a single AlAs monolayer. At AlAs optical mode frequencies, the normal longitudinal optical modes decay into the GaAs as damped transverse acoustic modes.

The zeroth order model is a one dimensional model to determine whether a baseline understanding of the salient features of electron-phonon interaction can be obtained for a simple case. We consider a monolayer or fractional monolayer of impurity atoms in a superlattice quantum well. The areal density of the monolayer atoms need not equal the areal density of the quantum well atoms but their spacing must be nearly periodic in the direction parallel to the superlattice planes and less than the electron coherence length. This monolayer is called the phonon generator and has a lattice constant of $2a$ along the superlattice quantum well. The confined electrons propagate parallel to the plane with energy $\epsilon_f + \epsilon_i$ where $\epsilon_f$ is the fermi energy and $\epsilon_i$ is the incremental energy arising from absorption or emission of phonons. In a binary system composed of monolayer atoms and one type of the host quantum well atoms all arranged in a single plane, the cation atom of one type will be located at $x = \pm a$ and the anion of the other atom type is located at $x=0$. Stable solutions of the electron plane wave kinetic energy will be of the form;

$$\epsilon = \epsilon_t + \epsilon_i \left[ 1 - \cos\left(\frac{m\pi x}{a} + \phi\right)\right]$$

where n is an integer and $\phi$ is a phase angle arising from polarization of the lattice by the electrons and corresponding displacement of the ions.

In one crystallographic orientation, (100) for example, the electron moves normal to dipoles formed by anions and cations in the phonon generator layer. The potential energy of the electron due to the two dimensional ion chain will be periodic and of the form:

$$V(x) = V_0 \cos\left[\frac{\pi(x+a)}{a} + \phi\right]$$

where x varies from $-a$ to $+a$. In a first order model, the finite quantum well thickness requries solutions with angular dependence as well at the spatial separation of electrons from the barrier ions. The Hamiltonian of the electron is $$H_i = \frac{p^2}{2m^*} + V_i(x)$$

The ion located at $x=0$ is also in motion. It is subjected to two short range or nearest neighbor forces, the electronic bond restoring force $(-Kx)$ and the coulomb force due to the electron $(-q^2/x)$. The ion is assumed to undergo stable vibrations along the x-direction according to the force equation $$F_j = -kx_j - \frac{q^2}{x_j} = M\frac{d^2 x_j}{dt^2}$$

where M is the mass of the ion and $F_j$ is the sum of forces on the jth ion. The Hamiltonian for the ion is $$p^2/2M + V(x) = H_M$$

The coupled equations for the ionic and electronic eigenvalues are solved simultaneously with periodic boundary conditions to find stable solutions which can be used for superlattice design. These classical equations of motion convey a phenomenological description of the problem. They can be reformulated in terms of a Hamiltonian for the system that can provide more useful design information.

As an example, in considering the optical modes of a bindary crystal havng masses m and M, the ion displacements are:

$$x_m = A\sin \omega t$$

$$x_M = B\sin (\omega t + \pi)$$

If the potential can be written as a product of a displacement term and a time dependent term, we have:

$$V(x,t) = \Sigma_m U_m(x) \sin (\omega t + \pi)$$

which is used in the eigenvalue equation.

The electron, which is confined at the quantun well, at $x = -a$ is accelerated due to the coulomb force of the anion. As it passes the anion, its velocity begins to decrease, again from the attractive coulomb interaction, and the repulsive force due to the adjacent cation. Finally, when the electron is at $x=a$, its kinetic energy is exactly equal to its value at $x = -a$. Meanwhile, the ions oscillate in their plane in modes determined by the chemical bond strengths and the electron-phonon interaction potential. When the electron is at $x=a$, another electron at $x = -a$ is attracted by the ion. In this manner, the two electrons are coupled together and phonon modes that dissipate electron energy have been removed by the superlattice.

The actual situation will be far more complex than portrayed by this simple picture. For example, the boundaries of electron motion in real space ($\pm a$) will probably correspond to a coherence length which can be much larger than a lattice constant. The stable orbits of electrons (or holes) will involve an energy gap which differes from the semiconductor bulk energy bandgap.

FIG. 1 illustrates one embodiment of the present invention wherein GaAs layers and AlGaAs are used to illustrate the invention. Other materials, as well as other III-V compound materials, could be used; however, GaAs and AlGaAs are well known and readily available to those in the semiconductor arts. FIG. 1 illustrates a superlattice structure having a monolayer 10 surrounded by narrow bandgap layers 11 and 12. Larger bandgap layhers 13 and 14 provide barrier layers. In a preferred embodiment, layers 10, 11, 12, 13, 14 would be repeated a multiplicity of times in order to increase phonon coupling by source in neighboring quantum wells that interact with the extended electron wave function and to generate additional current. Monolayer 10 consists of donors or acceptors which provide electronsor holes, respectively. If monolayer 10 is silicon, then electrons are provided. However, if monolayer 10 is electrically inactive, then electrons or holes can generated by exciting the monolayer crystal with a light source or by introducing charge carries from ohmic contacts. Monolayer 10 may be monatomic or diatomic.

Barrier layers 13 and 14 are used to confine electrons to the quantum will formed by layers 11 and 12. Metals, SiGe or the like could also be sued instead of GaAs for layers 11 and 12 to provide an excited state. Also the barrier layer could be an insulator, semiconductors and/or metals in various combinations providing a much larger potential well than AlGaAs/GaAs. Such suitable material can be epitaxially grown single crystal materials. However, one of the requirements is that the materials must be reasonably lattice matched, In a preferred embodiment, doping atoms are added to the quantum wells (layers 11 and 12) or else are added to barrier layers 13 and 14. If the doping atoms are provided to barrier layers 13 and 14, the electrons will than flow to the quantum wells.

Figure 2A:
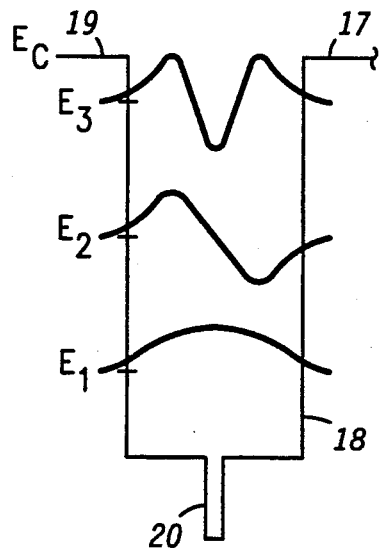
FIGS. 2a, 2b, and 2c illustrate quantum well characteristics of superlattice structures of the present invention.
Figure 2B:
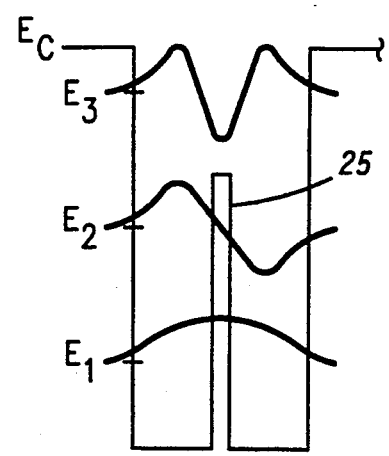
Figure 2C:
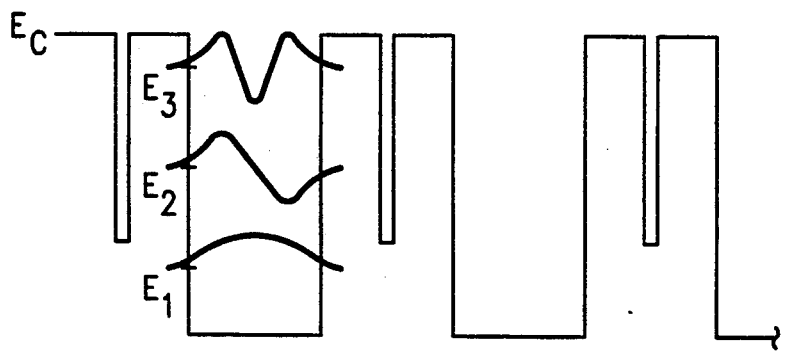

The phonon generator can be located in the barrier layer instead of the quantum well as shown in FIG. 2c. In this case the barrier layer thickness must sufficiently small to provide significant overlap of the wavefunction of electrons confined to the quantum well with the phonon generator. In this embodiment, the electrons do not share the same real space as the phonon generator so the ground state and upper excited states will not be perturbed; however, electron (or hole) phonon coupling will be reduced.

If the phonon generator thickness is greater than one monolayer, transverse phonon modes can be established which can dissipate the energy of paired electrons or holes, especially if the phonon generator and electrons occupy the same space. While the structure can still be highly conductive, superconductive properties such as current density and operating temperature will be degraded as the thickness increases and dissipation beings to dominate.

FIG. 2a illustrates quantum well 18 produced by layers 11 and 12 of FIG. 1. Barrier layer 13 is represented by upper line 17. Barrier layer 14 is represented by upper line 19. A plurality of superlattice structures as illustrated in FIG. 1 would result in a whole string of quantum wells 18 separated by barrier layers 17, 19. Quantum well 18 contains a notch 20 located at its bottom. Notch 20 can be considered as a second quantum well to represent monolayer 10. However, as shown in FIG. 2b, it will be understood that notch 20 could be represented by a protrusion or spike into quantum well 18 depending upon whether monolayer 10 is providing electrons or holes or is electrically inactive. Also shown in FIGS. 2a, 2b, 2c are energy sub-bands $E_1$, $E_2$, and $E_3$. The waveforms representing energy sub-bands $E_1$, $E_2$, and $E_3$ are commonly referred to as electron wave functions. The polarization modulation function for notch or quantum well 20 would appear as a single sine-like wave function extending into quantum well 18. The maximum amplitude of this wave function would coincide with the peak of sub-band $E_1$ and $E_3$, etc. This coincidence of the polarizations and electron wave function results in energy states with odd quantum numbers coupling easier. In other words, the polarization state of quantum well 20 would couple much easier to sub-band $E_1$ or $E_3$ than it would with sub-band $E_2$, since sub-band $E_2$ is at zero level at the peak of the polarization state of quantum well 20. Temperature or electric field can cause electrons to move from energy level $E_1$ to $E_2$ or $E_3$, The electrons excited by temperature or electric field produce reduced coupling to phonons from the phonon generator (monolayer 10 from FIG. 1 or 20 in FIG. 2a). FIGs. 2a, 2b, and 2c are representations of the conduction band ($E_c$) and it will be recognized that similar representations can be drawn for the valence band ($E_v$).

FIG. 2b is similar to FIG. 2a with the exceptions that quantum well 25, which represents monolayer 10 (FIG. 1), is shown as a barrier spike. FIG. 2c shows that monolayer 10 can be made in barrier layers 13 and 14 of FIG. 1.

Figure 3A:
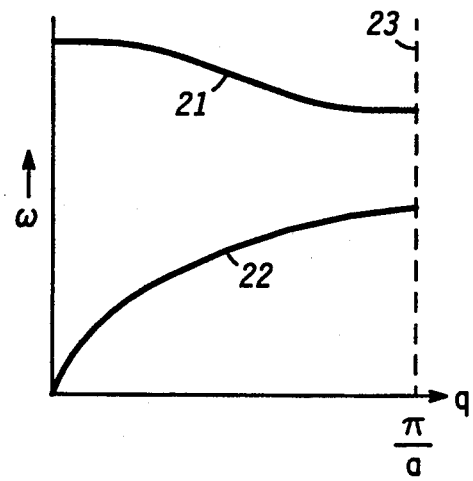
FIGS. 3a and 3b illustrate dispersion curves useful in understanding the present invention.

FIG. 3a illustrates a frequency versus wave number curve for the vibration modes of a diatomic linear lattice. One vibration branch contains the optical modes and illustrated by curve 21. The other vibration modes are in the acoustic branch illustrated by curve 22. Frequency which is proportional to energy is shown along the ordinate of the graph as $\omega$. The wave vector which is thougt of as momentum is shown along the abscissa of the graph as q. The wave vector or number, q, is inversely proportional to phonon wavelength. Dotted line 23 represents the Brillouin zone boundary, which is $\pi/a$, wherein a is the lattice constant or lattice parameter. As indicated by curves 21 and 22, the engergies associated with the two modes of vibration are, respectively, in the optical and acoustical range of the frequency spectrum. Therefore, an important distinction between the two types of phonons are that the optical phonons have higher energies, and there is an intermediate range of engergies for which there are no phonons of either kind for a particular material. This intermediate range occurs between curves 21 and 22. Another distinction is the manner in which the vibrations are excited. Optical phonons may be excited by photons bust acoustic phonons are generated by temperature or sound waves. Both types of phonons propagate through a solid and cause distortions in the arrangement of atoms or molecules. According to the BCS theory, some phonons are necessary for superconductivity to exist.

Figure 3B:
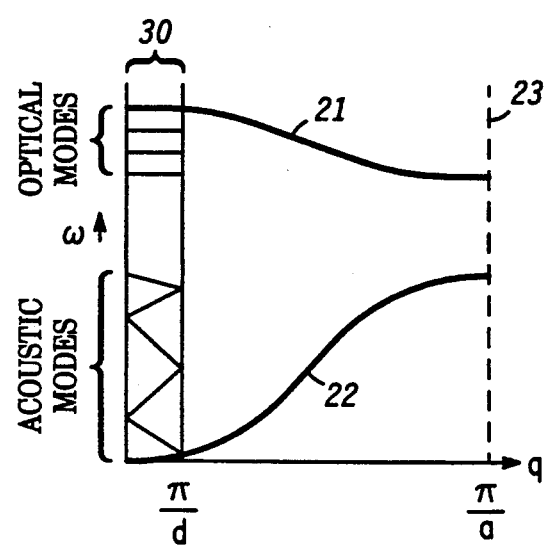

The dispersion curves in FIG 3a pertain to an extended solid or chain of atoms. When the solid is a periodic superlattice, the dispersion curve is modified as shown in FIG. 3b. In FIG. 3b, the original dispersion curve is "folded" back or reflected at the superlattice boundaries corresponding to multiples of $\pi/d$ where d is the period of the superlattice as shown at 25 in FIG. 2B. Therefore, in the superlattice, there are more phonons at say, q=0, than it the original crystal. In a recent publicaiton by B.K. Ridley in Phys. Rev. B, vol. 39No. 8, pp 5282-5286, 1989, it was shown that the electron scattering rate due to phonons located at the interface between a quantum well and the barrier was much greater than the intervalley or intravalley scattering rates when the quantum well was less than about 30-40 angstroms.

In this invention thin layers of material are inserted inside the quantum wells or barriers of a superlattice. In these thin layers, the interface phonons dominate the electron coupling within a particular temperature range and electron energy range. In other words, particular phonons have been selected to couple with electrons (or holes) so that the absorption and emission process causes pairing without dissipation. The particular phonons are designed based on the mechanical properties of the well and barrier materials. Their energy is less than the optical phonon energy of the quantum well material but their interaction with electrons or holes is much grater than the acoustic phonons. The energy of the interface optical phonons of the phonon generator layer lie between the acoustic and optical phonons of the quantum well.

In one embodiment of this invention the placement of the phonon generator is in the quantum well. In a regular two-dimensional array parallel to the electron (or hole) current, this will cause pairing of electrons (or holes) if the electron density is comparable to the areal density of phonon generators and when both electrons and phonon generator ions are spaced less than a coherence length apart. Moreover, the quantum well provides carrier confinement which reduces the scattering rate of carriers by the two dimensional phonons associated with the quantum well lattice (N. Sawaki, j Phys C, Solid State Phys, 19, (1986) 4965–4975.

One of the goals of the present invention is to generate optical phonons in the intermediate energy range between curves 21 and 22. Monolayer 10 (FIG. 1) will generate phonons having an energy level which is different from the optical phonons inherent in the host material of layers 11 and 12 (FIG. 1). The generated phonons will have a lower energy level to capture lower energy level electrons to prevent them from moving up to the host material optical phonon energy level. These lower energy electrons will then move through the material without dissipating energy (in other words, in a enhanced conductivity state) resulting in a continuous current due to the lack of dissipation. Impurities in the host material create coulombic charge and along with the phonons in the host material cause electrons to scatter and change direction, thereby creating resistance in the material. By using the generated phonons from the monolayer to pair low energy electrons, the electrons will move through the material without dissipating energy. The electrons can propagete without loss if they do not gain sufficient energy to launch an optical phonon from the host material. As long as the energy width of the ground state of the electron quantum well plus the optical phonon energy of the phonon generator lies within the forbidden phonon energy gap of the quantum well, there will be no net dissipation of electron energy. The phonon dispersion curve can be roughly estimated as follows:

for binary chain having atoms of mass, M, alternating with mass, m, the lower forbidden band edge frequency is $(2\beta/m)^{\frac{1}{2}}$ and the upper band edge frequency is $(2\beta/m)^{\frac{1}{2}}$ where $\beta = c/b$, c being the elastic stiffness and b is the lattice constant. The width of the quantum well ground state plus the optical phonon energy of the phonon generator must lie within these two boundaries. For a given set of superlattice layer materials, the band offset determines the well depth which, together with the well width, gives the ground state energy level.

Coupling of electrons can accrue form a phonon generator either within the barriers or within the superlattice quantum wells. In the prior case, of the 1-2-3 high temperature superlattices (HTSL), the Y lies inside the 2-D planes and Ba atoms lie outside the planes. Along the c-axis the Y is bounded above and below by the 2-D $CuO_2$ planes followed by Ba and finally CuO links to the adjacent cells. The atomic weight of Y is 88.9 while for Cu, Ba and 0 it is 63.5, 137.3 and 16 respectively. La can be used in place of Y. Its atomic weight is 138.9. Here the Ba-Y or Ba-La complex might be viewed as a giant source of phonons which can be coupled electrons in the 2D planes. Therefore, there must be a 2-D electron gas having a maximum energy that lies at least partly within the phonon forbidden bandgap of the 2-D planes and there must be a phonon source external to or within the 2-D planes having energies within the range needed to couple electrons to form pairs. This source may be the atom which lies in the quantum well generating the particular phonons required for electron pairing. Accordingly, the phonon source (monolayer 10) must provide phonons with energies within the range of the forbidden gap of the 2-D phonons.

By now, it should be appreciated that there has been provided a novel enhanced conductivity semiconductor superlattice which is believed to become superconductive at temperatures above superconductivity temperatures for the semiconductor materials. The invention employs a superlattice structure having a phonon generator sandwiched between two host material layers wherein the phonon generator generates phonons having optical energies lower than the optical energies and larger than the acoustical energies of the phonons of the host material.

I claim:

1. An enhanced conductivity III-V compund semiconductor comprising: a barrier layer; a first layer of material positioned on the barrier layer and having optical phonons at a predetermined energy level; a monoatomic layer positioned over the first layer and having optical phonons at an energy level lower than the energy level of the phonons of the first layer; and a second layer of material positioned on the monoatomic layer and having optical phonons at substantially the same energy level as the first layer of material.

2. The enhanced conductivity compound semiconductor of claim 1 wherein the barrier layer comprises AlGaAs, the first and second layers comprise GaAs, and the monoatomic layer comprises silicon.

3. The enhanced conductivity compound semiconductor of claim 1 wherein the barrier layer serves to confine electrons to a quantum well formed by the first and second layers and the monoatomic layer.

4. An enhanced conductivity compound semiconductor having a plurality of quantum wells, each quantum well being separated by a barrier layer, and each quantum well comprising a first and a second layer of semi-insulating material having phonons at a predetermined energy level; and a monoatomic layer located in between the first and the second layers and having phonons with an optical energy level lower than the optical energy level of the first and second layers.

5. The enhanced conductivity compound semiconductor of claim 4 wherein the monoatomic layer comprises a semiconducting material.

6. The enhanced conductivity compound semiconductor of claim 4 wherein the semi-insulating material comprises III-V compound material.

7. The enhanced conductivity compound semiconductor of claim 5 wherein the semiconducting material comprises silicon.

8. A synthetic enhanced conductivity compound semiconductor having a superlattice structure and comprising:
 a phonon generator; and
 a host material having at least two layers, wherein the phonon generator is sandwiched between the two layers of the host material.

9. The synthetic enhanced conductivity compound semiconductor of claim 8 wherein the phonon generator generates phonons having optical energies lower than optical energies and greater than acoustical energies of phonons of the host material.

10. The synthetic enhanced conductivity compound semiconductor of claim 8 further including a barrier layer to prevent electrons from the host material from escaping the superlattice quantum wells.

11. A III-V compound semiconductor structure having at least one barrier layer with a monolayer in the barrier layer producing optical phonons.

12. The III-V compound semiconductor of claim 11 wherein the monolayer comprises acceptor atoms to produce holes.

13. The III-V compound semiconductor of claim 11 wherein the barrier layers are epitaxially grown single crystal insulators which are void of oxygen.

14. A synthetic enhanced conductivity compound semiconductor having a superlattice and a monolayer, the superlattice having a crystal lattice and quantum wells and wherein the monolayer has electrically inactive atoms in the crystal lattice of the superlattice which produces optical phonons, and charge carriers and generated by illumination or introduced by ohmic contacts to the superlattice quantum wells.

15. The synthetic enhanced conductivity compound semiconductor of claim 14 wherein the quantum wells are expitaxially grown single crystal metals.

16. The synthetic enhanced conductivity compound semiconductor of claim 14 wherein the quantum wells are SiGe single crystal and the barriers are silicon.

* * * * *